United States Patent
Schmitt et al.

(10) Patent No.: US 8,031,506 B2
(45) Date of Patent: Oct. 4, 2011

(54) ONE-TIME PROGRAMMABLE MEMORY CELL

(75) Inventors: Jonathan Schmitt, Eden Prairie, MN (US); Roy Carlson, Plymouth, MN (US)

(73) Assignee: Broadcom Corporation, Irvine, CA (US)

( * ) Notice: Subject to any disclaimer, the term of this patent is extended or adjusted under 35 U.S.C. 154(b) by 569 days.

(21) Appl. No.: 12/077,888

(22) Filed: Mar. 21, 2008

(65) Prior Publication Data

US 2009/0237975 A1    Sep. 24, 2009

(51) Int. Cl.
*G11C 17/16* (2006.01)
(52) U.S. Cl. ............... 365/96; 257/530; 257/209
(58) Field of Classification Search ............ 257/509, 257/529, 530, E27.078; 365/96; 438/131, 438/467, 600, 957
See application file for complete search history.

(56) References Cited

U.S. PATENT DOCUMENTS

| | | | | |
|---|---|---|---|---|
| 5,646,438 A | * | 7/1997 | Frerichs | 257/530 |
| 2006/0291267 A1 | * | 12/2006 | Jenne et al. | 365/102 |
| 2008/0211060 A1 | * | 9/2008 | Chang et al. | 257/530 |

* cited by examiner

*Primary Examiner* — Marcos D Pizarro Crespo
*Assistant Examiner* — Sue Tang
(74) *Attorney, Agent, or Firm* — Farjami & Farjami LLP

(57) ABSTRACT

A disclosed embodiment is a programmable memory cell having improved IV characteristics comprising a thick oxide spacer transistor interposed between a programmable thin oxide antifuse and a thick oxide access transistor. The spacer transistor separates a rupture site formed during programming the programmable antifuse from the access transistor, so as to result in the improved IV characteristics. The programmable antifuse is proximate to one side of the spacer transistor, while the access transistor is proximate to an opposite side of the spacer transistor. The source region of the access transistor is coupled to ground, and the drain region of the access transistor also serves as the source region of the spacer transistor. The access transistor is coupled to a row line, while the spacer transistor and the programmable antifuse are coupled to a column line. The rupture site is formed during programming by applying a programming voltage to the programmable antifuse.

20 Claims, 4 Drawing Sheets

ONE-TIME PROGRAMMABLE MEMORY CELL

BACKGROUND OF THE INVENTION

1. Field of the Invention

The present invention is generally in the field of memory devices. More particularly, the present invention relates to programmable memory cells.

2. Background Art

One type of conventional one-time programmable memory cell is implemented using an antifuse and an access transistor situated at the intersection of a row line and a column line (i.e. a bit line). The antifuse is coupled between the column line and the access transistor drain. The access transistor gate is coupled to the row line, and the access transistor source is coupled to ground. When the antifuse is unprogrammed, no current can pass through the antifuse and access transistor, because the antifuse is an open circuit. This state corresponds to an unprogrammed state of the memory cell. To program the memory cell, a programming voltage is applied to the column line, rupturing the antifuse. When the programmed memory cell is read, a conductive path is formed from the column line (i.e. the bit line) through the rupture site in the antifuse and to ground through the access transistor.

This type of conventional memory cell may exhibit an unpredictable and wide range of IV (current-voltage) characteristics after being programmed, because the antifuse rupture site location is a big variable. For example, the antifuse may rupture near the access transistor drain, resulting in one set of IV characteristics, or far from the access transistor drain, resulting in a different set of IV characteristics. This variation in IV characteristics between different programmed memory cells makes it difficult to determine whether a particular memory cell has been properly programmed, and what value is stored in the memory cell. Such difficulty can require the implementation of redundancy schemes or other costly compensatory measures.

Thus, there is a need in the art for a one-time programmable memory cell that exhibits improved predictability and improved IV characteristics.

SUMMARY OF THE INVENTION

A one-time programmable memory cell, substantially as shown in and/or described in connection with at least one of the figures, and as set forth more completely in the claims.

DETAILED DESCRIPTION OF THE INVENTION

The present invention is directed to a one-time programmable memory cell. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings.

Figure 1:
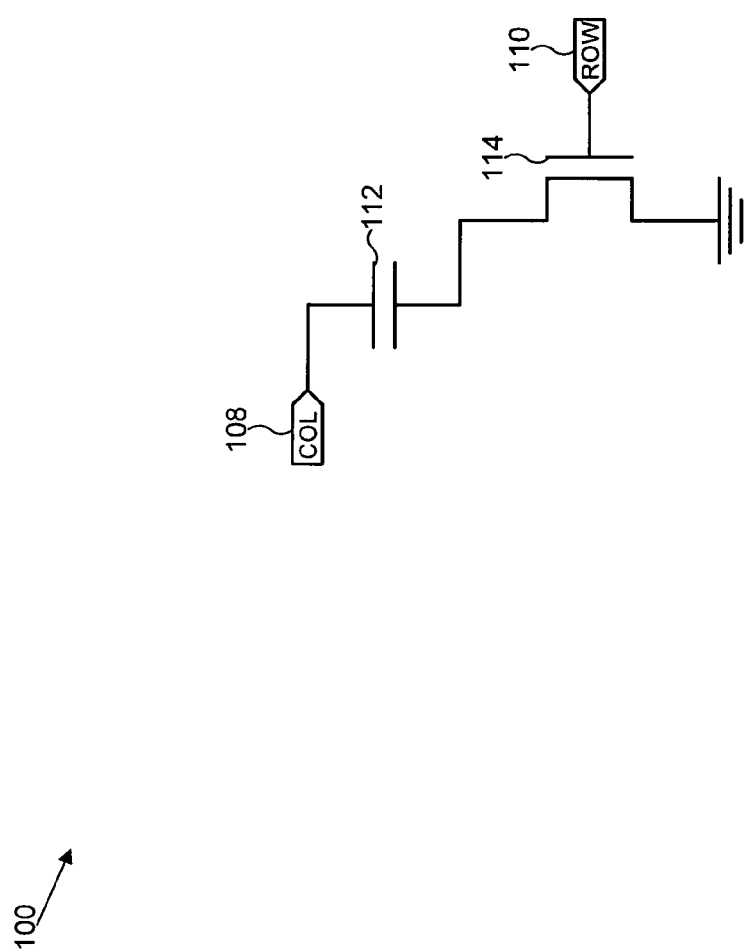
FIG. 1 shows a conventional one-time programmable memory cell.

A conventional one-time programmable memory cell 100 is shown in FIG. 1. Memory cell 100 includes column line (i.e. bit line) 108, programmable thin oxide antifuse 112, thick oxide access transistor 114, and row line 110. Memory cell 100, which stores one bit of information based on the state of antifuse 112 (i.e. based on whether antifuse 112 is "programmed" or "unprogrammed"), is fabricated in the unprogrammed state and may be programmed only once. Once programmed, memory cell 100 cannot revert to the unprogrammed state.

Memory cell 100 can be programmed by applying a programming voltage to antifuse 112 through column line 108, and a supply voltage to the gate of access transistor 114 through row line 110. The supply voltage on the gate of access transistor 114 reduces the source to drain impedance of access transistor 114, thereby coupling antifuse 112 to ground through access transistor 114. The resulting programming voltage potential across antifuse 112 is sufficient to rupture antifuse 112, thereby placing antifuse 112 in a low impedance state, i.e. the programmed state.

Memory cell 100 can be read by applying the supply voltage to antifuse 112 through column line 108 and to the gate of access transistor 114 through row line 110. The supply voltage on the gate of access transistor 114 reduces the source to drain impedance of access transistor 114, thereby coupling the programmed antifuse 112 to ground through access transistor 114. If antifuse 112 is unprogrammed, the resulting supply voltage potential across antifuse 112 is not sufficient to rupture antifuse 112, because in conventional memory cell 100 the supply voltage is less than the programming voltage. Thus, column line 108 will remain at the supply voltage potential, indicating an unprogrammed state. However, if antifuse 112 is programmed, column line 108 will be pulled to ground through access transistor 114. Thus, the potential on column line 108 will decline sufficiently below the supply voltage to indicate a programmed state.

Figure 2:
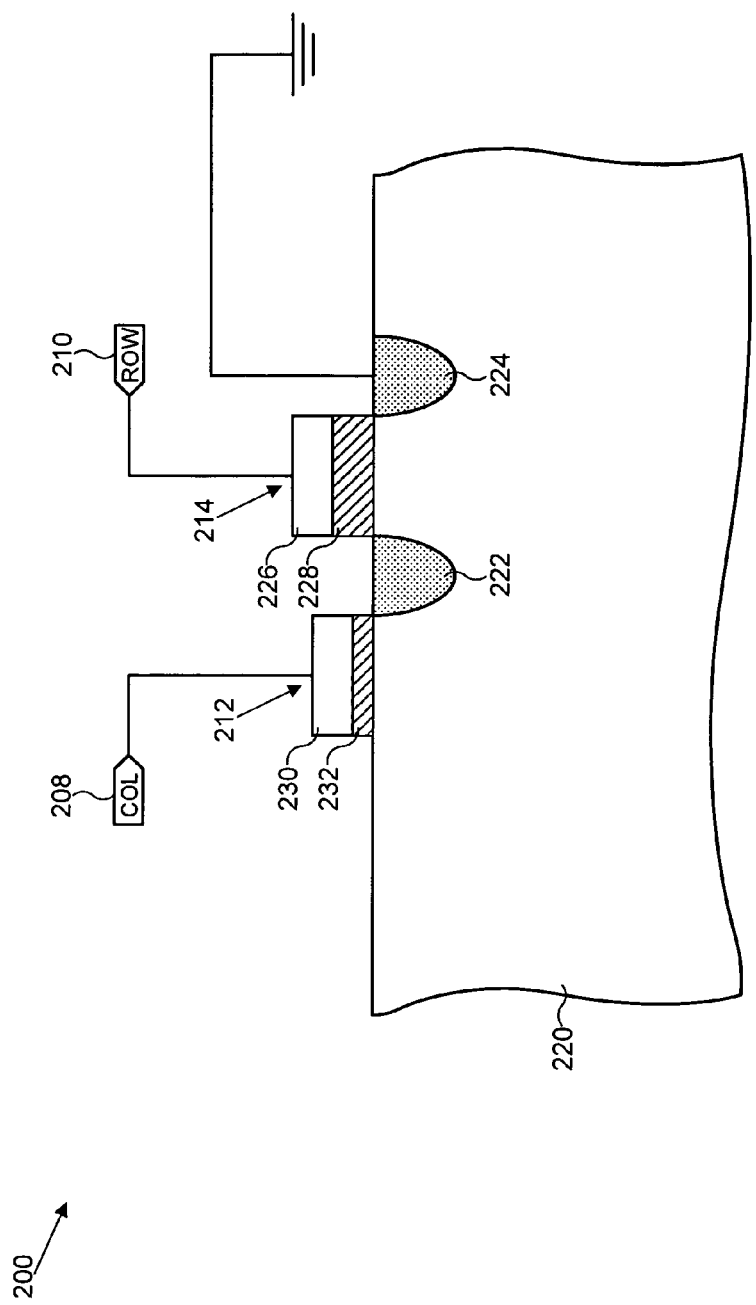
FIG. 2 shows a conventional one-time programmable memory cell cross-section.

A cross section view of conventional memory cell 100 is shown in FIG. 2, and referred to as conventional memory cell 200 in the present application. Conventional memory cell 200 includes column line 208, programmable thin oxide antifuse 212, thick oxide access transistor 214, and row line 210. These elements correspond respectively to column line 108, antifuse 112, access transistor 114, and row line 110 in memory cell 100 in FIG. 1. In one example, antifuse 212 comprises polysilicon layer 230 and thin oxide layer 232 on substrate 220. Access transistor 214 comprises polysilicon gate 226, thick oxide layer 228, source region 224, and drain region 222. Gate 226 and thick oxide layer 228 are on substrate 220, while source and drain regions 224 and 222, are diffusion regions in substrate 220. In the present example, substrate 220 can be a conventional silicon substrate.

In one conventional implementation, the programming voltage for memory cell 200 can be approximately 5 volts, and the supply voltage can be approximately 1.2 volts. Other conventional examples may utilize different programming and supply voltages. However, in all conventional examples the programming voltage must be high enough to rupture oxide layer 232 when applied through column line 208 during a programming operation, but the supply voltage must not be high enough to rupture oxide layer 232 when applied through column line 208 during a read operation.

Memory cell 200 can be programmed by applying the programming voltage to antifuse 212 through column line (i.e. bit line) 208, and the supply voltage to access transistor 214 through row line 210. The supply voltage on gate 226 of access transistor 214 reduces the impedance between source region 224 and drain region 222, thereby reducing the impedance between drain region 222 and ground. The resulting voltage potential between polysilicon layer 230 and ground across thin oxide layer 232 is sufficient to rupture antifuse 212, i.e. rupture a permanent conducting path through thin oxide layer 232, thereby coupling column line 208 to ground through drain region 222 of access transistor 214.

Memory cell 200 can be read by applying the supply voltage to antifuse 212 through column line 208 and to gate 226 through row line 210. The supply voltage on gate 226 reduces the impedance between source region 224 and drain region 222, thereby coupling antifuse 212 to ground through access transistor 214. If antifuse 212 is unprogrammed, the resulting supply voltage potential across antifuse 212 is not sufficient to rupture antifuse 212. Thus, column line 208 will remain at the supply voltage potential, indicating an unprogrammed state. However, if antifuse 212 is programmed, column line 208 will be pulled to ground through access transistor 214. Thus, the potential on column line 208 will decline sufficiently below the supply voltage to indicate a programmed state.

The IV (current-voltage) characteristics of a programmed instance of conventional memory cell 200 can vary unpredictably and widely, leading to difficulty in determining whether the memory cell has been programmed. This variability of IV characteristics occurs primarily because of variations in the locations of rupture sites in oxide layer 232. For example, a first programmed instance of memory cell 200 in which a rupture site in thin oxide layer 232 occurs close to drain region 222 will exhibit a low impedance. In contrast, a second programmed instance of memory cell 200 in which a rupture site in thin oxide layer 232 occurs farther from drain region 222 will exhibit a higher impedance. While both the first and second programmed instances of memory cell 200 will exhibit an impedance lower than an unprogrammed memory cell, the variation in programmed impedance can make it difficult to ascertain the state of memory cell 200 during a read operation. Such difficulty can reduce programming yield and lead to programming uncertainty, requiring, for example, implementation of redundancy schemes or other costly compensatory measures.

Figure 3:
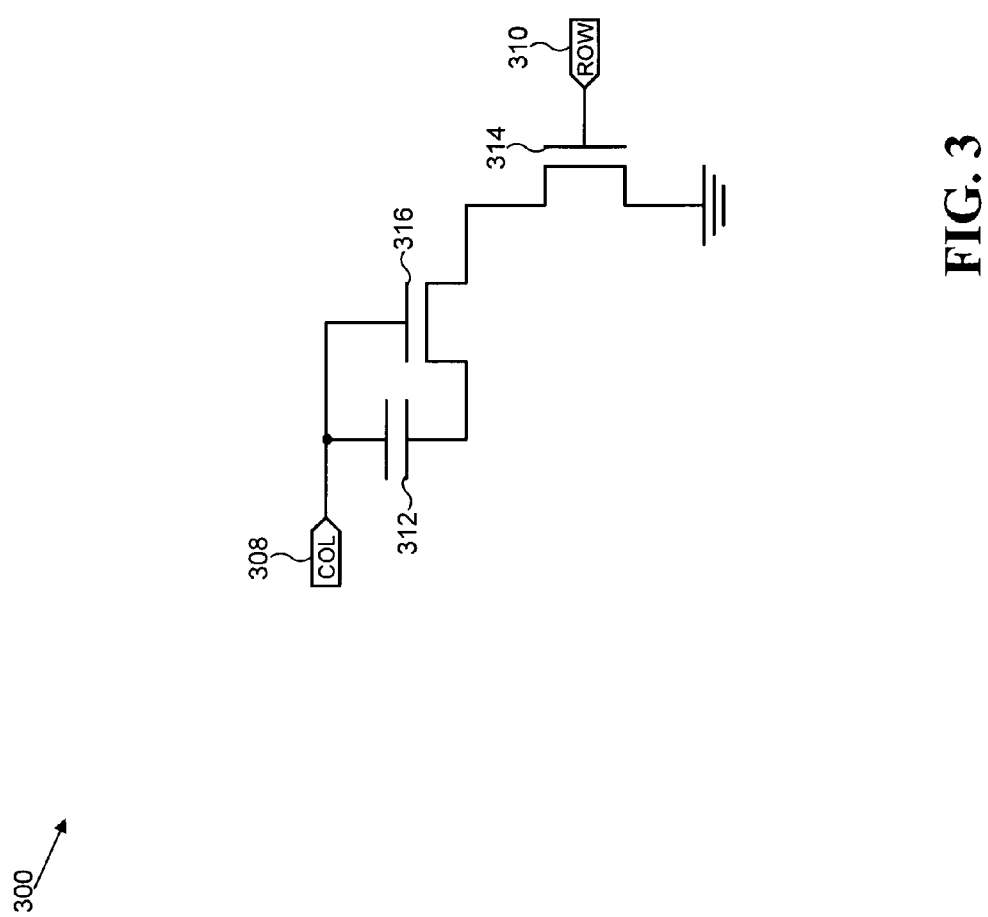
FIG. 3 shows a one-time programmable memory cell, according to one embodiment of the present invention.

One-time programmable memory cell 300, in accordance with one embodiment of the present invention, is shown in FIG. 3. Memory cell 300 includes column line (i.e. bit line) 308, programmable thin oxide antifuse 312, thick oxide spacer transistor 316, thick oxide access transistor 314, and row line 310. Memory cell 300, which stores one bit of information based on the state of antifuse 112 (i.e. based on whether antifuse 112 is "programmed" or "unprogrammed"), is fabricated in the unprogrammed state and may be programmed only once. Once programmed, memory cell 300 cannot revert to the unprogrammed state.

Memory cell 300 can be programmed by applying a programming voltage to antifuse 312 through column line 308, and a supply voltage to the gate of access transistor 314 through row line 310. The supply voltage on the gate of access transistor 314 reduces the source to drain impedance of access transistor 314. Additionally, the programming voltage on the gate of spacer transistor 316 reduces the impedance between the drain of access transistor 314 and antifuse 312. Antifuse 312 is thereby coupled to ground through spacer and access transistors 316 and 314. The resulting voltage potential across antifuse 312 is sufficient to rupture antifuse 312, thereby placing antifuse 312 in a low impedance state, i.e. the programmed state.

Memory cell 300 can be read by applying the supply voltage to antifuse 312 and the gate of spacer transistor 316 through column line 308 and to the gate of access transistor 314 through row line 310. The supply voltage on the gate of access transistor 314 reduces the source to drain impedance of access transistor 314. Additionally, the supply voltage on the gate of spacer transistor 316 reduces the impedance of spacer transistor 316. Programmed antifuse 312 is thereby coupled to ground across spacer and access transistors 316 and 314. If antifuse 312 is unprogrammed, the resulting supply voltage potential across antifuse 312 is not sufficient to rupture antifuse 312. Thus, column line 308 will remain at the supply voltage potential, indicating an unprogrammed state. However, if antifuse 312 is programmed, column line 308 will be pulled to ground through spacer transistor 316 and access transistor 314. Thus, the potential on column line 308 will decline sufficiently below the supply voltage to indicate a programmed state. In particular, the potential on column line 308 will decline to the switching threshold of spacer transistor 316, which in one exemplary embodiment might be approximately 0.7 volts.

Figure 4:
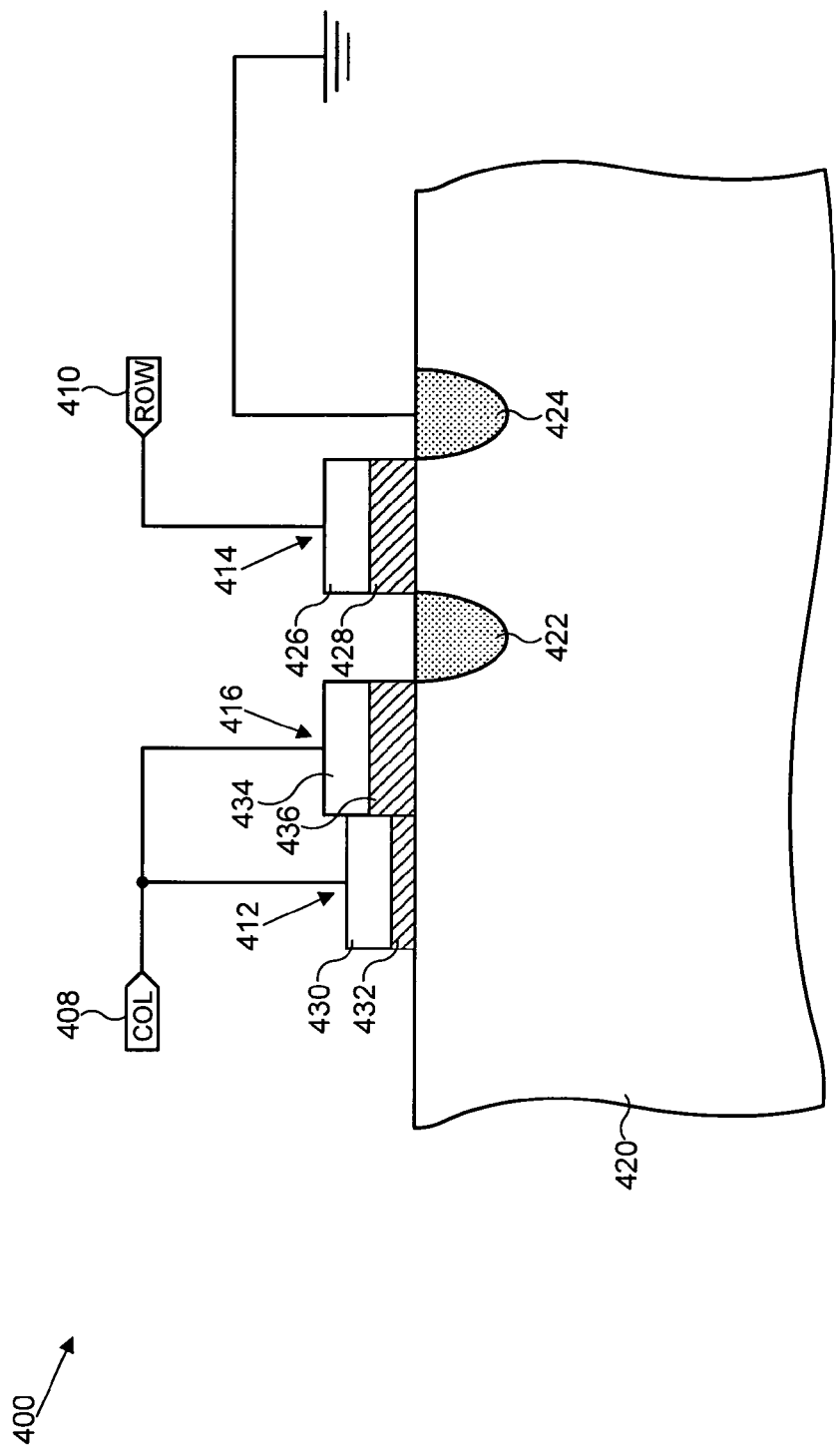
FIG. 4 shows a one-time programmable memory cell cross-section, according to one embodiment of the present invention.

A cross section view of the invention's memory cell 300 is shown in FIG. 4, and referred to as the invention's memory cell 400 in the present application. Memory cell 400 includes column line (i.e. bit line) 408, programmable thin oxide antifuse 412, thick oxide spacer transistor 416, thick oxide access transistor 414, and row line 410. These elements correspond respectively to column line 308, programmable thin oxide antifuse 312, thick oxide spacer transistor 316, thick oxide access transistor 314, and row line 310 in memory cell 300 in FIG. 3. Antifuse 412 abuts (i.e. is generally proximate to) one side of spacer transistor 416, while drain region 422 of access transistor 414 abuts (i.e. is generally proximate to) an opposite side of spacer transistor 416. Notably, drain region 422 is the drain of access transistor 414 and is also the source of spacer transistor 416.

In one embodiment, antifuse 412 comprises polysilicon layer 430 and thin oxide layer 432 on substrate 420. In one embodiment, spacer transistor 416 comprises polysilicon gate 434, thick oxide layer 436, and drain region 422. In one embodiment, access transistor 414 comprises polysilicon gate 426, thick oxide layer 428, source region 424, and drain region 422. Gates 426 and 434 and thick oxide layers 428 and 436 are on substrate 420, while source and drain regions 424 and 422 are diffusion regions in substrate 420. As indicated above, in one embodiment, layer 430, gate 434, and gate 426 can comprise polysilicon, but different gate materials can be used in various embodiments of the invention. Substrate 420 can, in one embodiment, comprise silicon, although different substrate materials can be used in various embodiments of the invention.

In one implementation, the programming voltage for memory cell 400 might be approximately 5 volts, and the supply voltage might be approximately 1.2 volts. Other embodiments of the invention may utilize different programming and supply voltages. However, in all embodiments the programming voltage must be high enough to rupture thin oxide layer 432 when applied through column line 408 during a programming operation, but not so high as to rupture adjacent thick oxide layer 436. Additionally, in all embodiments the supply voltage must not be high enough to rupture thin oxide layer 432 when applied through column line 408 during a read operation.

Memory cell 400 can be programmed by applying the programming voltage to antifuse 412 and spacer transistor 416 through column line (i.e. bit line) 408, and the supply voltage to access transistor 414 through row line 410. The supply voltage on gate 426 of access transistor 414 reduces the impedance between source region 424 and drain region 422, thereby reducing the impedance between drain region 422 and ground. Additionally, the programming voltage on gate 434 of spacer transistor 416 reduces the impedance between drain region 422 and antifuse 412. The resulting voltage potential between polysilicon layer 430 and ground across thin oxide layer 432 of antifuse 412 is sufficient to rupture antifuse 412, i.e. rupture a permanent conducting path through oxide layer 432, thereby coupling column line 408 to ground through drain region 422 of access transistor 414.

Memory cell 400 can be read by applying the supply voltage to antifuse 412 and spacer transistor 416 through column line 408, and to gate 426 of access transistor 414 through row line 410. The supply voltage on gate 426 of access transistor 414 reduces the impedance between source region 424 and drain region 422. Additionally, the supply voltage on gate 434 of spacer transistor 416 reduces the impedance between drain region 422 and antifuse 412, thereby coupling antifuse 412 to ground through access transistor 414. If antifuse 412 is unprogrammed, the resulting supply voltage potential across antifuse 412 is not sufficient to rupture antifuse 412. Thus, column line 408 will remain at the supply voltage potential, indicating an unprogrammed state. However, if antifuse 412 is programmed, column line 408 will be pulled to ground through antifuse 412 and across spacer transistor 416 and access transistor 414. Thus, the potential on column line 408 will decline sufficiently below the supply voltage to indicate a programmed state.

The IV (current-voltage) characteristics of programmed instances of memory cell 400 are beneficially made more uniform by the interposition of spacer transistor 416 between antifuse 412 and access transistor 414. Spacer transistor 416 ensures a minimum distance between a rupture site in thin oxide layer 432 and drain region 422. Whether a rupture site occurs on one side of thin oxide layer 432 or on an opposite side of thin oxide layer 432, the additional buffer distance to drain region 422 imposed by spacer transistor 416 significantly reduces the impact of the exact location of the rupture site and thus makes the IV characteristic of the programmed memory cell much more uniform across many instances. This improvement in IV characteristics facilitates ascertaining the state of memory cell 400 during a read operation and leads to more programming certainty, thereby avoiding imposition of redundancy schemes or other costly compensatory measures.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a one-time programmable memory cell has been described.

The invention claimed is:

1. A programmable memory cell having improved IV characteristics comprising:
    a thick oxide spacer transistor connected to a first terminal and a second terminal of a programmable thin oxide antifuse, said thick oxide spacer transistor further connected to a thick oxide access transistor;
    wherein an oxide layer of said programmable thin oxide antifuse is thinner than an oxide layer of said thick oxide spacer transistor and an oxide layer of said thick oxide access transistor;
    said thick oxide spacer transistor separating a rupture site of said programmable thin oxide antifuse from said thick oxide access transistor so as to result in said improved IV characteristics.

2. The programmable memory cell of claim 1, wherein said programmable thin oxide antifuse is proximate a one side of said thick oxide spacer transistor.

3. The programmable memory cell of claim 2, wherein said thick oxide access transistor is proximate an opposite side of said thick oxide spacer transistor.

4. The programmable memory cell of claim 1, wherein a first source region of said thick oxide access transistor is coupled to ground.

5. The programmable memory cell of claim 1, wherein a first drain region of said thick oxide access transistor serves as a source region of said thick oxide spacer transistor.

6. The programmable memory cell of claim 1, wherein a first gate of said thick oxide access transistor is coupled to a row line.

7. The programmable memory cell of claim 1, wherein a gate of said thick oxide spacer transistor is coupled to a column line.

8. The programmable memory cell of claim 1, wherein said programmable thin oxide antifuse is coupled to a column line.

9. The programmable memory cell of claim 1, wherein said programming said programmable thin oxide antifuse comprises applying a programming voltage to said programmable thin oxide antifuse via a column line to generate said rupture site.

10. The programmable memory cell of claim 9, wherein said programming said programmable thin oxide antifuse further comprises applying said programming voltage to said thick oxide spacer transistor via said column line.

11. The programmable memory cell of claim 9, wherein said programming said programmable thin oxide antifuse further comprises applying a supply voltage to said thick oxide access transistor via a row line.

12. The programmable memory cell of claim 1, wherein reading said programmable memory cell comprises applying a supply voltage to said programmable thin oxide antifuse via a column line.

13. The programmable memory cell of claim 12, wherein said reading said programmable memory cell further comprises applying said supply voltage to said thick oxide spacer transistor via said column line.

14. The programmable memory cell of claim 13, wherein said reading said programmable memory cell further comprises applying said supply voltage to said thick oxide access transistor via a row line.

15. The programmable memory cell of claim 14, wherein a programming voltage is greater than said supply voltage.

16. The programmable memory cell of claim 1, wherein reading said programmable memory cell comprises applying a supply voltage to said thick oxide access transistor via a row line.

17. A programmable memory cell having improved IV characteristics comprising:
- a thick oxide spacer transistor connected to a first terminal and a second terminal of a programmable thin oxide antifuse said thick oxide spacer transistor further connected to a thick oxide access transistor;
- wherein an oxide layer of said programmable thin oxide antifuse is thinner than an oxide layer of said thick oxide spacer transistor and an oxide layer of said thick oxide access transistor;
- said thick oxide spacer transistor separating a rupture site of said programmable thin oxide antifuse from said thick oxide access transistor so as to result in said improved IV characteristics;
- a first drain region of said thick oxide access transistor serving as a source region of said thick oxide spacer transistor.

18. The programmable memory cell of claim 17, wherein said programming said programmable thin oxide antifuse comprises applying a programming voltage to said programmable thin oxide antifuse via a column line to generate said rupture site.

19. The programmable memory cell of claim 18, wherein said programming said programmable thin oxide antifuse further comprises applying said programming voltage to said thick oxide spacer transistor via said column line.

20. The programmable memory cell of claim 18, wherein said programming said programmable thin oxide antifuse further comprises applying a supply voltage to said thick oxide access transistor via a row line.

* * * * *